(12) United States Patent
Wang et al.

(10) Patent No.: US 6,274,494 B1
(45) Date of Patent: Aug. 14, 2001

(54) METHOD OF PROTECTING GATE OXIDE

(75) Inventors: Mu-Chun Wang, Hsinchu Hsien; Yih-Jau Chang, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/215,632

(22) Filed: Dec. 16, 1998

(51) Int. Cl.⁷ .............................. H01L 21/44; H01L 21/31
(52) U.S. Cl. .................. 438/680; 483/683; 483/763; 483/778
(58) Field of Search ................................. 438/763, 680, 438/683, 778

(56) References Cited

U.S. PATENT DOCUMENTS

| | | | |
|---|---|---|---|
| 4,892,843 | * | 1/1990 | Schmitz et al. . |
| 5,837,557 | * | 11/1998 | Fulford, Jr. et al. . |
| 5,936,300 | * | 8/1999 | Sasada et al. . |
| 6,069,069 | * | 5/2000 | Chooi et al. . |

* cited by examiner

*Primary Examiner*—John F. Niebling
*Assistant Examiner*—Josetta I. Jones
(74) *Attorney, Agent, or Firm*—Charles C. H. Wu; Charles C.H. Wu & Associates

(57) ABSTRACT

A method of protecting gate oxide. A chip having a gate thereon is provided. The gate structure comprises a gate oxide layer and a gate electrode. The gate is covered by a dielectric layer. A protection layer is formed on the dielectric layer. The protection layer is pattern to remain a part of the protection layer aligned over the gate.

16 Claims, 3 Drawing Sheets

METHOD OF PROTECTING GATE OXIDE

BACKGROUND OF THE INVENTION

1. Field of the Invention

The invention relates in general to a method of protecting gate oxide, and more particularly, to a method of protecting gate oxide by forming a protection layer.

2. Description of the Related Art

In the conventional method of fabricating a gate of a metal-oxide semiconductor (MOS), a very thin gate oxide layer is formed on a semiconductor substrate. A polysilicon layer on the gate oxide layer is formed for the formation of a gate electrode. A gate is thus formed and comprises the gate oxide layer and the gate electrode. To achieve the interconnection, a dielectric layer is formed on the gate as an isolation layer between the gate and a metal layer formed subsequently. While more than one metal layer is required for interconnection, a dielectric layer is formed between every two consecutive metal layers. The dielectric layer between two metal layers is called an inter-layer dielectric layer (ILD) or inter-metal dielectric layer (IML).

During the formation of the dielectric layer, the metal layer, and the inter-metal dielectric layers, a plasma process is often performed. The particles contained in the plasma may penetrate the dielectric layer to damage the gate oxide layer. In addition, an intensive light, including ultra-violet light or other short wavelength light, is generated during plasma etching. These short wavelength lights may transmit through the dielectric layer or inter-metal dielectric layer to further damage the gate oxide layer.

For a semiconductor device with a line width of deep sub-micron, the quality of a gate oxide layer is a crucial factor to determine the quality of a device. As the thickness of a gate oxide layer is typically thinner than 100 Å, the gate oxide layer is easily to be damaged. Once the gate oxide layer is damaged, the yield of produce is degraded.

FIG. 1 shows a conventional fabrication method of interconnection which damages the gate oxide layer.

In FIG. 1, after the formation of a gate oxide layer 102 on a substrate 100, and a gate electrode layer 104 on the gate oxide layer, a dielectric layer 106 is formed to cover the gate electrode 104 and the substrate 100. A anisotropic plasma etching is performed to remove a part of the dielectric layer 106, so as to form a contact window (not shown). The charged particles 110 contained in the plasma penetrate through the dielectric layer 106 to damage the gate oxide layer 102. An intensive light with a short wavelength generated by the plasma etching process may transmit through the dielectric layer 106 to impinge the gate oxide layer 102. The intensive light has a high energy to induce electron-hole pairs in the gate oxide layer 102. As a consequence, the quality of the gate oxide layer 102 is deteriorated.

SUMMARY OF THE INVENTION

It is an object of the invention to provide a method of protecting gate oxide. By this method, the damage caused by the particles contained in the plasma and the generated light to result a degraded yield of products is prevented.

To achieve the above-mentioned objects and advantages, a method of protecting gate oxide is provided. On a substrate having a gate thereon, a dielectric layer is formed. The gate comprises a gate oxide layer on the substrate, and a gate electrode on the gate oxide layer. A thin conductive layer is formed on the gate as a protection layer for the subsequent plasma etching process.

By the protection of the thin conductive layer, the particles contained in the plasma and the light generated by the plasma are blocked from penetrating through. The damage caused in the conventional method is prevented. As a consequence, the quality of the gate oxide layer is not deteriorated, and the yield of the products is maintained.

Both the foregoing general description and the following detailed description are exemplary and explanatory only and are not restrictive of the invention, as claimed.

DESCRIPTION OF THE PREFERRED EMBODIMENTS

Figure 1:
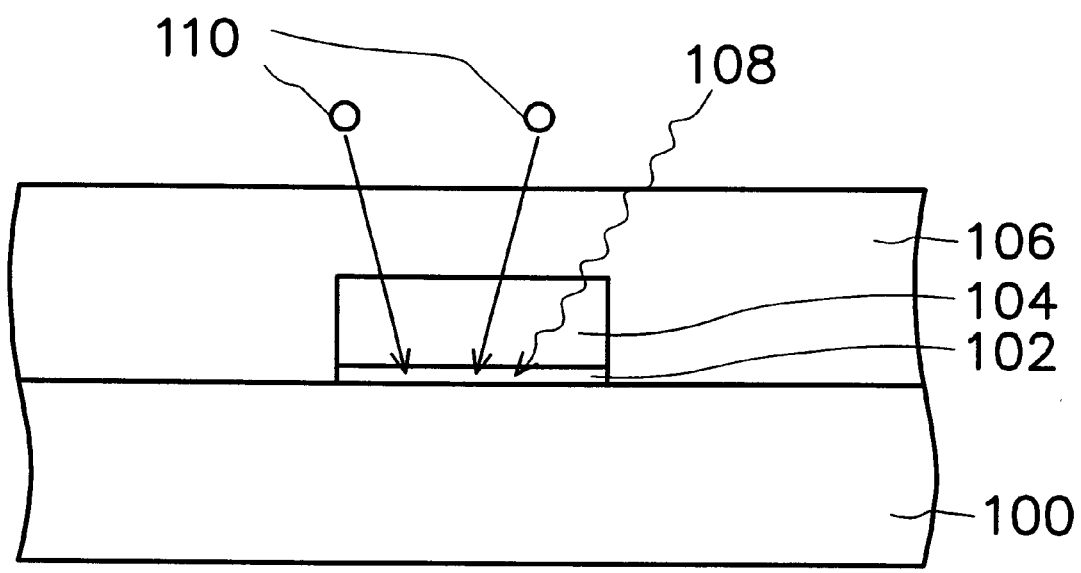
FIG. 1 shows a conventional method of interconnection fabrication.
Figure 2A:
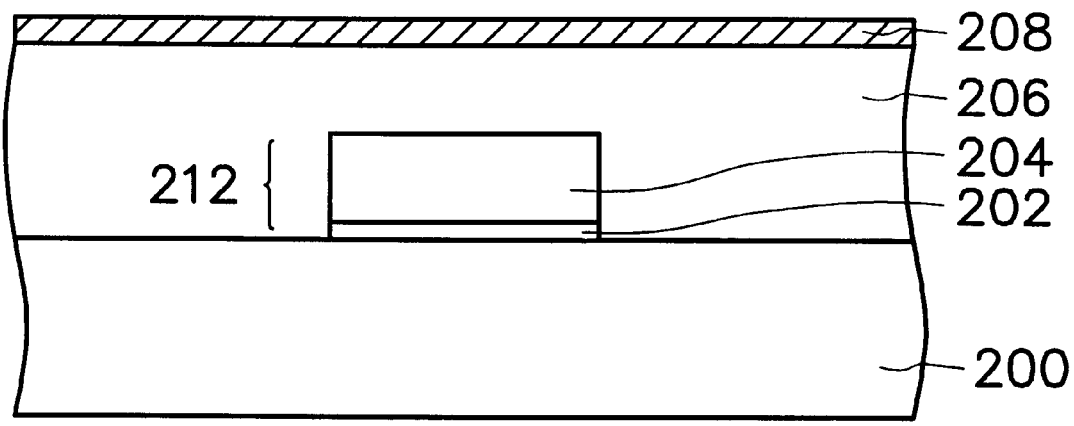
FIG. 2A to FIG. 2C are cross sectional views showing a method of protecting gate oxide.
Figure 2B:
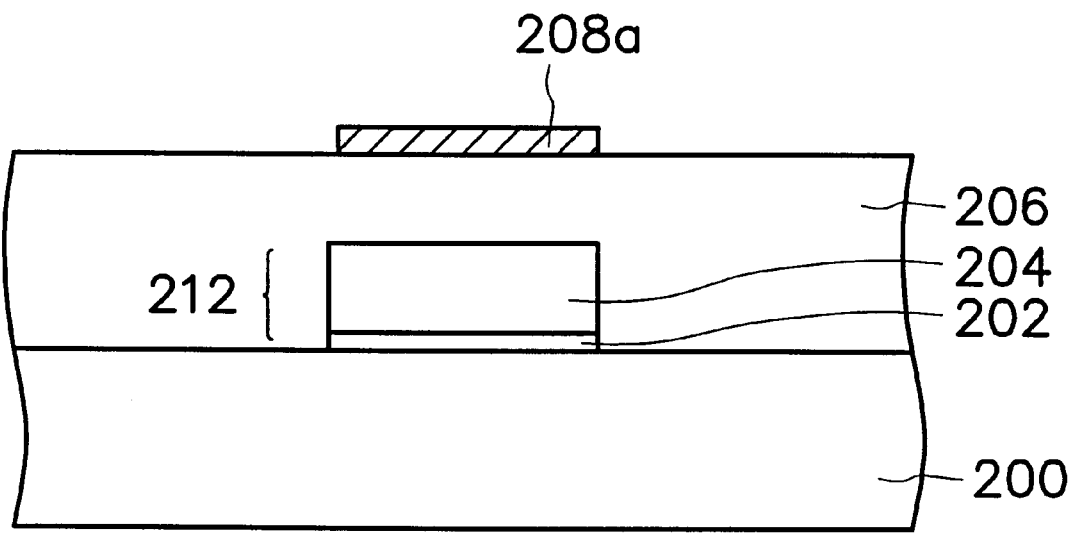
Figure 2C:
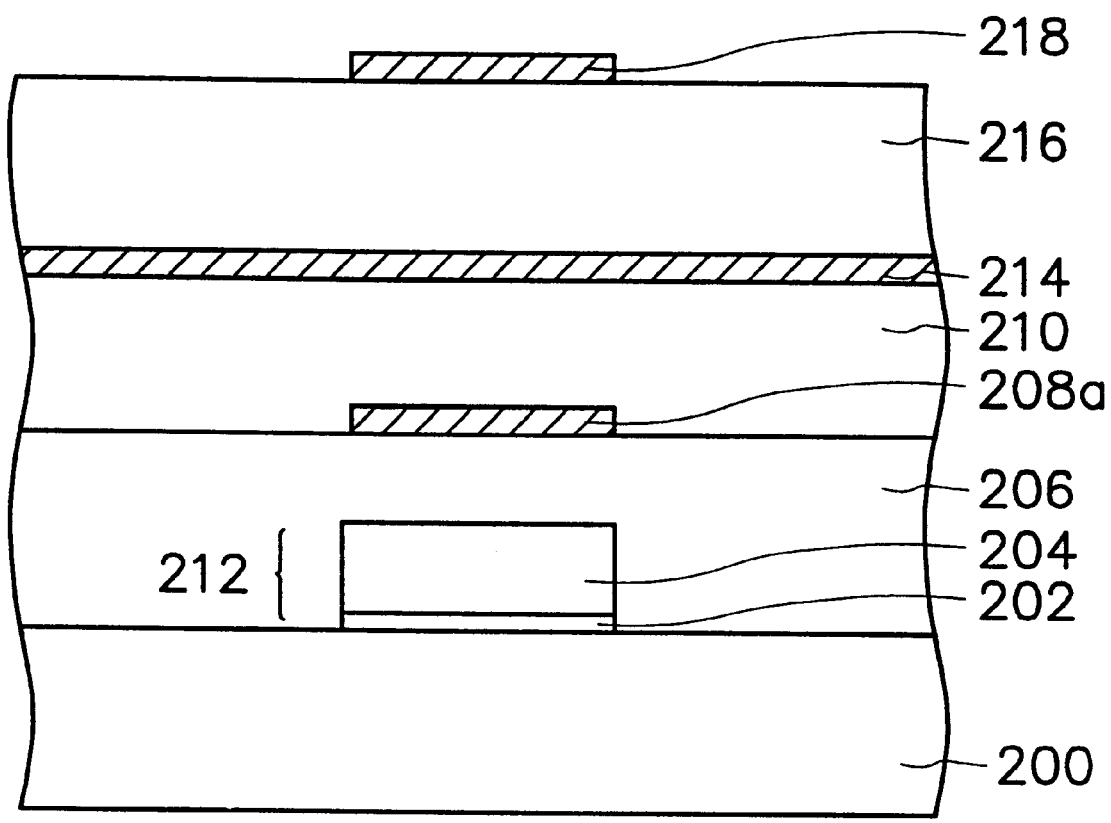

FIG. 2A to FIG. 2C are cross sectional views showing a method of protecting gate oxide.

In FIG. 2A, a gate oxide layer 202 is formed on a substrate 200. A gate electrode 204 is formed on the gate oxide layer 202. A gate 212 is thus formed comprising the gate oxide layer 202 and the gate electrode 204. The material of the gate electrode 204 includes, for example, polysilicon. A dielectric layer 206 is formed on the substrate 200 and the gate 212. The material of the dielectric layer 206 includes insulator such as silicon oxide. A protection layer 208, for example, a conductive layer such as a tungsten layer formed by chemical vapor deposition (CVD), is formed on the dielectric layer 206.

In FIG. 2B, using photolithography and etching, a part of the protection layer 208 is removed. The remaining part of the protection layer 208a is aligned over the gate 212. Preferably, a photo-mask used to define the gate 212 is used in the step of removing the protection layer 208. The etching process is performed by an anisotropic plasma etching step.

In FIG. 2C, an alternative method of protecting the gate oxide layer is shown. It is appreciated that the method of protecting the gate oxide layer is not confined to the formation of the protection layer 208a only. After the formation of the protection layer 208a over the gate 212, multi-level interconnects and inter-metal dielectric layers are fabricated. While fabricating the multi-level interconnect, protection layers may be required as a protection layer. As shown in the figure, the multi-level interconnects comprise a dielectric layer 210, a metal layer 214, an inter-metal dielectric layer 216, and a protection layer 218. The dielectric layer 210 is formed to cover the dielectric layer 206 and the protection layer 208a. The metal layer 214 is formed on the dielectrc layer 216. The dielectric layer 216 is formed to cover the metal layer 214, while the protection layer 218 is formed on the diselectric layer 216, perferably, over the protection layer 208a.

In the invention, a protection layer is formed on a gate, or even on each metal layer to protect the gate oxide and other device structure from being damage in a subsequent fabrication process.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of protecting gate oxide, comprising:

providing a substrate having a gate thereon;

forming a dielectric layer on the substrate and the gate;

forming a patterned protection layer on the dielectric layer, the patterned protection layer being aligned over both sides of the gate.

2. The method according to claim 1, wherein the gate further comprises a gate oxide layer on the substrate, and a gate electrode on the substrate.

3. The method according to claim 1, the step of forming the protection layer comprising chemical vapor deposition.

4. A method of protecting gate oxide, comprising:

providing a substrate having a gate thereon;

forming a dielectric layer on the substrate and the gate; and forming a protection layer on the dielectric layer aligned over both sides of the gate, wherein the protection layer comprises a conductive layer.

5. A method of protecting gate oxide, comprising:

providing a substrate having a gate thereon;

forming a dielectric layer on the substrate and the gate; and forming a protection layer on the dielectric layer aligned over both sides of the gate, wherein the protection layer comprises a tungsten layer.

6. A method of protecting gate oxide, comprising:

providing a substrate;

forming a gate oxide layer on the substrate;

forming a gate electrode on the gate oxide layer;

forming a dielectric layer on the gate electrode and the substrate;

forming a first protection layer on the dielectric layer;

patterning the first protection layer, the patterned first protection layer being aligned over both sides of the gate electrode;

forming an inter-metal dielectric layer on the patterned first protection layer and the dielectric layer; and forming a second protection layer on the inter-metal dielectric layer being aligned over the first protection layer.

7. The method according to claim 6, wherein the first protection layer comprises a conductive layer.

8. The method according to claim 6, wherein the first protection layer comprises a tungsten layer.

9. The method according to claim 6, wherein the second protection layer is aligned over the first patterned protection layer.

10. The method according to claim 6, wherein the second protection layer comprises a conductive layer.

11. The method according to claim 6, wherein the second protection layer comprises a tungsten layer.

12. A fabrication method for a multi-level interconnect, comprising:

forming a gate on a substrate;

forming a first dielectric layer on the gate and the substrate;

forming a first protection layer on the dielectric layer, wherein the first protection layer aligned over both sides of the gate;

forming a second dielectric layer on the first protection layer and on the first dielectric layer;

f forming a metal layer on the second dielectric layer;

forming a third dielectric layer on the metal layer; and forming a second protection layer on the third dielectric layer, wherein the second protection layer aligned over the first protection layer.

13. The method according to claim 12, wherein the gate further comprises a gate oxide layer and a gate electrode.

14. The method according to claim 12, wherein the first protection layer and the second protection layer comprise a conductive layer.

15. The method according to claim 12, wherein the first protection layer and the second protection layer comprise a tungsten layer.

16. The method according to claim 12, wherein the metal layer includes an interconnect layer.

\* \* \* \* \*